(12) United States Patent
Mandeville et al.

(10) Patent No.: US 10,564,231 B1
(45) Date of Patent: Feb. 18, 2020

(54) RF WINDOWING FOR MAGNETOMETRY

(71) Applicant: LOCKHEED MARTIN CORPORATION, Bethesda, MD (US)

(72) Inventors: Andrew Raymond Mandeville, Philadelphia, PA (US); Arul Manickam, Mount Laurel, NJ (US); Gregory Scott Bruce, Abington, PA (US); Peter G. Kaup, Marlton, NJ (US); Stephen M. Alessandrini, Medford, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 16/242,938

(22) Filed: Jan. 8, 2019

(51) Int. Cl.
*G01R 33/26* (2006.01)

(52) U.S. Cl.
CPC ................................. *G01R 33/26* (2013.01)

(58) Field of Classification Search
CPC ...................................................... G01R 33/26
See application file for complete search history.

(56) References Cited

U.S. PATENT DOCUMENTS

| 10,228,429 | B2 * | 3/2019 | Bruce | G01R 33/032 |
| 2016/0216340 | A1 * | 7/2016 | Egan | G01R 33/032 |
| 2016/0216341 | A1 * | 7/2016 | Boesch | G01R 33/032 |
| 2017/0212182 | A1 * | 7/2017 | Hahn | G01R 33/0052 |
| 2017/0343695 | A1 * | 11/2017 | Stetson | G01V 3/101 |

OTHER PUBLICATIONS

Facey, G., "Shaped Pulses for Selective Excitation", University of Ottawa NMR Facility Blog, Dec. 7, 2007, 3 pages.
Facey, G., "Excitation Profiles for Shaped Pulses", University of Ottawa NMR Facility Blog, Jan. 20, 2011, 4 pages.

* cited by examiner

*Primary Examiner* — G. M. A Hyder
(74) *Attorney, Agent, or Firm* — Foley & Lardner LLP

(57) ABSTRACT

A system for magnetic detection of an external magnetic field can include a RF excitation source generating a RF excitation pulse, and an optical excitation source to generate an optical excitation pulse to apply to the magneto-optical defect center element. The system can include a controller to cause a weighting window function to be applied to the RF excitation signal to generate a corresponding weighted windowed RF excitation signal that is applied to the magneto-optical defect center element. The system can include an optical detector receiving an optical signal based on light emitted by the magneto-optical defect center element responsive to the optical excitation pulse. The controller can receive a light detection pulse from the optical detector, and generate a magnetometry curve as a function of RF excitation frequency using the light detection signal. The controller can generate a representation of a magnetic field based on the magnetometry curve.

20 Claims, 9 Drawing Sheets

RF WINDOWING FOR MAGNETOMETRY

FIELD

The present disclosure generally relates to magnetometers using magneto-optical defect center materials, and more particularly, to RF windowing for RF pulses to reduce inter-axis interference for magnetometry systems.

BACKGROUND

The following description is provided to assist the understanding of the reader. None of the information provided or references cited is admitted to be prior art. Some magnetometers use magneto-optical defect center materials to determine a magnetic field. Such magnetometers can direct light into the magneto-optical defect center material. Magneto-optical defect center materials with defect centers can be used to sense an applied magnetic field by transmitting light into the materials and measuring the responsive light that is emitted.

A number of industrial and scientific areas such as physics and chemistry can benefit from magnetic detection and imaging with a device that has improved sensitivity and/or the ability to capture signals that fluctuate rapidly (i.e., improved bandwidth) with a package that is small in size, efficient in power and reduced in volume. Many advanced magnetic imaging systems can operate in restricted conditions, for example, high vacuum and/or cryogenic temperatures, which can make them inapplicable for imaging applications that require ambient or other conditions. Furthermore, small size, weight and power (SWAP) magnetic sensors of moderate sensitivity, vector accuracy, and bandwidth are valuable in many applications.

SUMMARY

Methods and systems are described for, among other things, a magneto-optical defect center magnetometer.

According to at least one aspect, a system for magnetic detection of an external magnetic field can include a magneto-optical defect center element comprising a plurality of magneto-optical defect centers. The system can include a radio frequency (RF) excitation source configured to generate at least one RF excitation pulse to cause RF excitation of the magneto-optical defect center element. The system can include an optical excitation source configured to generate an optical excitation pulse to apply to the magneto-optical defect center element. The system can include an optical detector configured to receive an optical signal based on light emitted by the magneto-optical defect center element responsive to the optical excitation pulse. The system can include a controller. The controller can control the RF excitation source to generate the at least one RF excitation signal. The controller can cause a weighting window function to be applied to the at least one RF excitation signal generated by the RF excitation source to generate at least one corresponding weighted windowed RF excitation signal. The at least one weighted windowed RF excitation signal can be applied to the magneto-optical defect center element. The controller can receive a light detection pulse from the optical detector responsive to the optical signal received by the optical detector based on the light emitted by the magneto-optical defect center element. The controller can generate a magnetometry curve as a function of RF excitation frequency using, at least in part, the light detection signal. The controller can generate a representation of a magnetic field based, at least in part, on the magnetometry curve.

In some implementations, the weighting window function includes can include a Hann window function, a Hamming window function, a Hanning-Poisson window function, a Riemann window function or a Chebyshev window function.

In some implementations, the RF excitation source can be configured to cause the weighting window function to be applied to a first RF excitation signal generated by the RF excitation source to generate a corresponding first weighted windowed RF excitation signal. The first weighted windowed RF excitation signal can be applied to the magneto-optical defect center element. The RF excitation source can be configured to cause the weighting window function to be applied to a second RF excitation signal generated by the RF excitation source to generate a corresponding second weighted windowed RF excitation signal. The second weighted windowed RF excitation signal can be applied to the magneto-optical defect center element a time period $\tau$ after applying the first weighted windowed RF excitation signal. The time period $\tau$ can be defined based on the weighting window function. A first phase of the first RF excitation signal can be different from a second phase of the second RF excitation signal.

In some implementations, the weighting window function can have a side lobe-drop off rate higher than a predefined threshold value. A frequency spectrum of the weighting window function can exhibit a null at a predefined frequency. A frequency spectrum of the weighting window function can have a sidelobe at a predefined frequency. The weighting window function can be a non-rectangular weighting window function and at least one width of the at least one RF excitation signal can be determined based on the non-rectangular weighting window function. The magneto-optical defect center element can be a nitrogen vacancy (NV) diamond material comprising a plurality of NV centers.

According to at least one other aspect, a process for magnetic detection using a magneto-optical defect center element comprising a plurality of defect centers can include a radio frequency (RF) excitation source generating at least one RF excitation signal to use for RF excitation of the magneto-optical defect center element. The method can include an optical excitation source generating an optical excitation pulse to apply to the magneto-optical defect center element. The method can include applying a weighting window function to be to the at least one RF excitation signal generated by the RF excitation source to generate at least one corresponding weighted windowed RF excitation signal. The at least one weighted windowed RF excitation signal applied to the magneto-optical defect center element. The method can include an optical detector receiving an optical signal based on light emitted by the magneto-optical defect center element responsive to the optical excitation pulse. The method can include a controller receiving a light detection signal from the optical detector responsive to the optical signal received by the optical detector based on the light emitted by the magneto-optical defect center element. The method can include generating a magnetometry curve as a function of RF excitation frequency using, at least in part, the light detection signal. The method can include generating a representation of a magnetic field based, at least in part, on the magnetometry curve.

In some implementations, the weighting window function includes can include a Hann window function, a Hamming window function, a Hanning-Poisson window function, a Riemann window function or a Chebyshev window function.

In some implementations, applying the weighting window function to the at least one RF excitation signal can include applying the weighting window function to a first RF excitation signal generated by the RF excitation source to generate a corresponding first weighted windowed RF excitation signal, and applying the weighting window function to a second RF excitation signal generated by the RF excitation source to generate a corresponding second weighted windowed RF excitation signal. The first weighted windowed RF excitation signal can be applied to the magneto-optical defect center element. The second weighted windowed RF excitation signal can be applied to the magneto-optical defect center element a time period $\tau$ after applying the first weighted windowed RF excitation signal. The time period $\tau$ may be defined based on the weighting window function. A first phase of the first RF excitation signal may be different from a second phase of the second RF excitation signal.

In some implementations, the weighting window function can have a side lobe-drop off rate higher than a predefined threshold value. A frequency spectrum of the weighting window function can exhibit a null at a predefined frequency. A frequency spectrum of the weighting window function can have a sidelobe at a predefined frequency. The weighting window function can be a non-rectangular weighting window function and at least one width of the at least one RF excitation signal can be determined based on the non-rectangular weighting window function.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The details of one or more implementations are set forth in the accompanying drawings and the description below. Other features, aspects, and advantages will become apparent from the description, the drawings, and the claims, in which:

It will be recognized that some or all of the figures are schematic representations for purposes of illustration. The figures are provided for the purpose of illustrating embodiments with the explicit understanding that they will not be used to limit the scope or the meaning of the claims.

DETAILED DESCRIPTION

Atomic-sized magneto-optical defect centers, such as nitrogen-vacancy (NV) centers in diamond lattices, can have excellent sensitivity for magnetic field measurement and enable fabrication of small magnetic sensors. Magneto-optical defect center materials include but are not be limited to diamonds, Silicon Carbide (SiC), Phosphorous, and other materials with nitrogen, boron, carbon, silicon, or other defect centers. Diamond nitrogen vacancy (DNV) sensors may be maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe triplet spin states (e.g., with $m_s$=−1, 0, +1) of the NV centers to split based upon an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers. In some implementations, microwave RF excitation is used in a DNV sensor.

Magneto-optical defect center materials are those that can modify an optical wavelength of light directed at the defect center based on a magnetic field in which the magneto-defect center material is exposed. In some implementations, the magneto-optical defect center material may utilize nitrogen vacancy centers. Nitrogen-vacancy (NV) centers are defects in a diamond's crystal structure. Synthetic diamonds can be created that have these NV centers. NV centers generate red light when excited by a light source, such as a green light source, and microwave radiation. When an excited NV center diamond is exposed to an external magnetic field, the frequency of the microwave radiation at which the diamond generates red light and the intensity of the generated red light change. By measuring this change and comparing the change to the microwave frequency that the diamond generates red light at when not in the presence of the external magnetic field, the external magnetic field strength can be determined. Accordingly, NV centers can be used as part of a magnetic field sensor.

Figure 1:
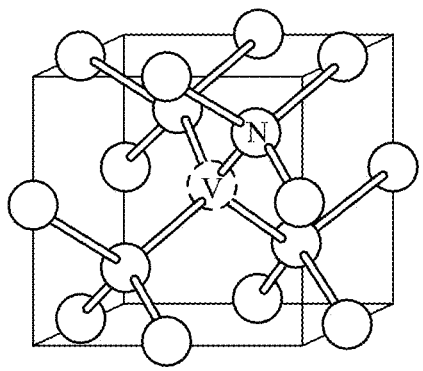
FIG. 1 illustrates one orientation of a Nitrogen-Vacancy (NV) center in a diamond lattice.

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. The neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
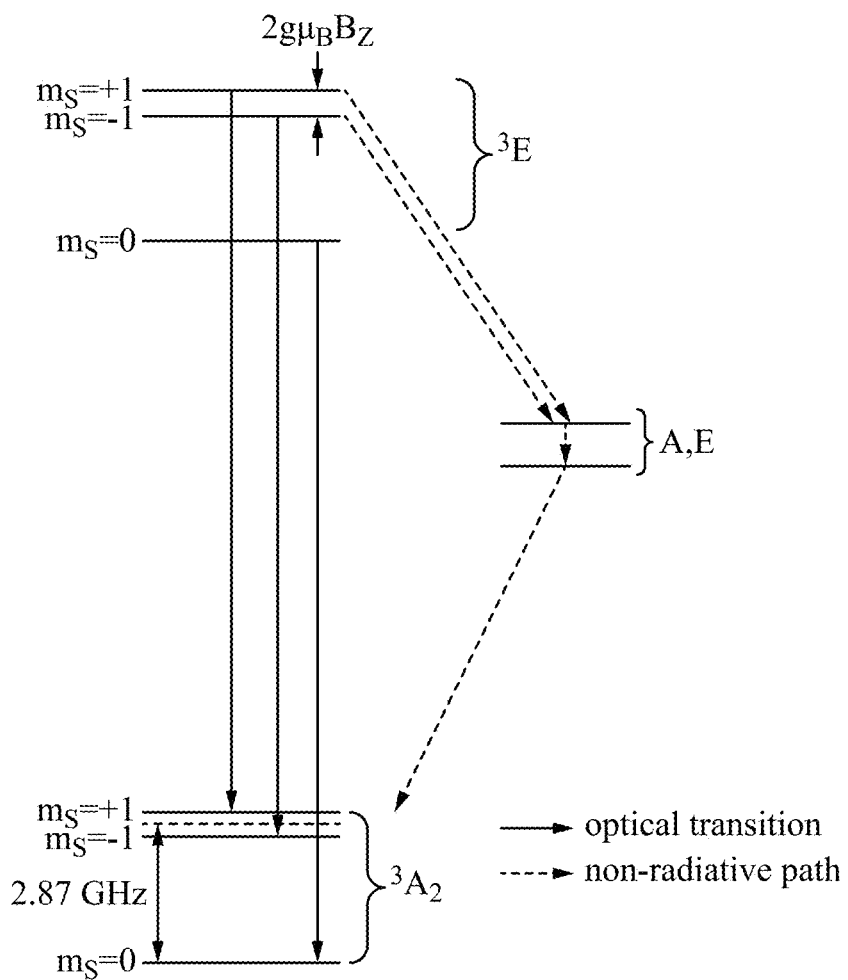
FIG. 2 illustrates an energy level diagram showing energy levels of spin states for a NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=0$ energy levels are offset from the $m_s=0$ due to spin-spin interactions, and the $m_s=+1$ energy levels are degenerate, i.e., they have the same energy. The $m_s=0$ spin state energy level is split from the $m_s=+1$ energy levels by an energy of approximately 2.87 GHz for a zero external magnetic field.

Introducing an external magnetic field with a component along the NV axis lifts the degeneracy of the $m_s=+1$ energy levels, splitting the energy levels $m_s=+1$ by an amount $2g\mu_B B_z$, where g is the g-factor, $\mu_B$ is the Bohr magneton, and $B_z$ is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=+1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=+1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=+1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=+1$ states than for the $m_s=0$ spin state. This is so because the decay via the intermediate states does not result in a photon emitted in the fluorescence band, and because of the greater probability that the $m_s=+1$ states of the excited triplet $^3E$ state will decay via the non-radiative decay path. The lower fluorescence intensity for the $m_s=+1$ states than for the $m_s=0$ spin state allows the fluorescence intensity to be used to determine the spin state. As the population of the $m_s=+1$ states increases relative to the $m_s=0$ spin, the overall fluorescence intensity will be reduced.

Figure 3:
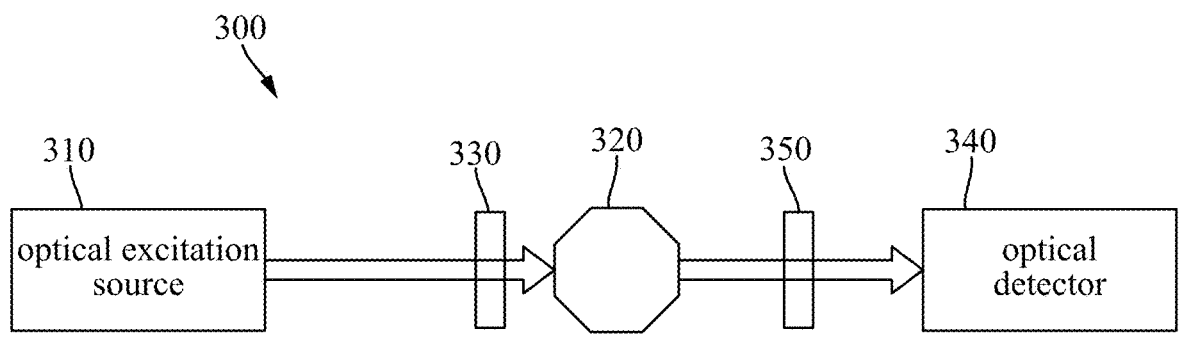
FIG. 3 illustrates a schematic diagram of a magneto-optical defect center magnetic sensor system.

FIG. 3 is a schematic diagram illustrating a NV center magnetic sensor system 300 that uses fluorescence intensity to distinguish the $m_s=+1$ states, and to measure the magnetic field based on the energy difference between the $m_s=+1$ state and the $m_s=-1$ state, as manifested by the RF frequencies corresponding to each state. The system 300 includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance and a subsequent decrease in fluorescence intensity occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state.

The optical excitation source 310 may be a laser or a light emitting diode, for example, which emits light in the green (light having a wavelength such that the color is green), for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

Figure 4:
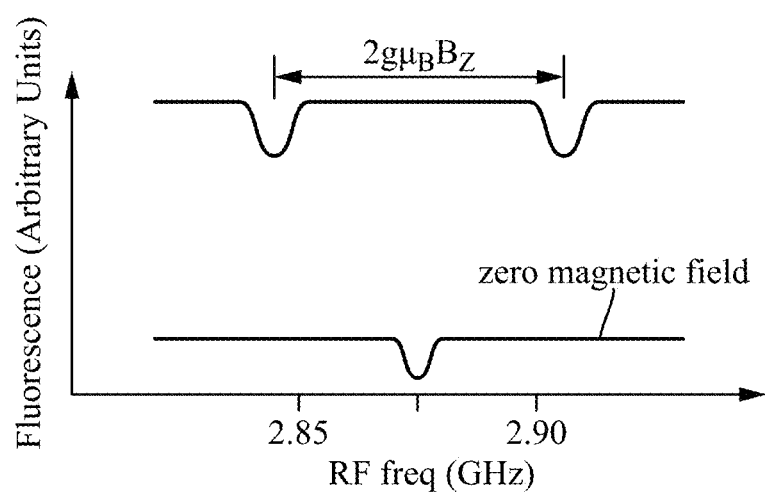
FIG. 4 illustrates a graph of the fluorescence as a function of an applied RF frequency of a magneto-optical defect center along a given direction for a zero magnetic field and for a magnetic field of amplitude $B_z$.

For continuous wave excitation, the optical excitation source 310 continuously pumps the NV centers, and the RF excitation source 330 sweeps across a frequency range that includes the zero splitting (when the $m_s=+1$ spin states have the same energy) photon energy of approximately 2.87 GHz. The fluorescence for an RF sweep corresponding to a NV diamond material 320 with NV centers aligned along a single direction is shown in FIG. 4 for different magnetic field components $B_z$ along the NV axis, where the energy splitting between the $m_s=-1$ spin state and the $m_s=+1$ spin state increases with $B_z$. Thus, the component $B_z$ may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

Figure 5A:
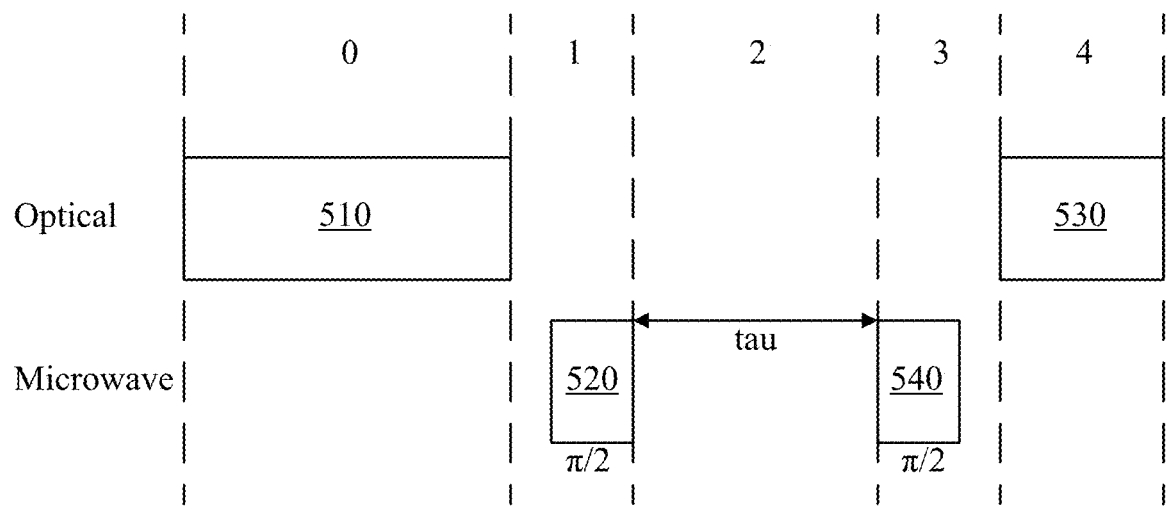
FIG. 5A illustrates a schematic of a Ramsey sequence of optical excitation pulses and RF excitation pulses.

The Ramsey pulse sequence is a pulsed RF-pulsed laser scheme that measures the free precession of the magnetic moment in the NV diamond material 320 with NV centers, and is a technique that quantum mechanically prepares and samples the electron spin state. FIG. 5A is a schematic diagram illustrating the Ramsey pulse sequence. As shown in FIG. 5A, a Ramsey pulse sequence includes optical excitation pulses and RF excitation pulses over a five-step period. In a first step, during a period 0, a first optical excitation pulse 510 is applied to the system to optically pump electrons into the ground state (i.e., $m_s=0$ spin state). This is followed by a first RF excitation pulse 520 (in the form of, for example, a microwave (MW) $\pi/2$ pulse) during a period 1. The first RF excitation pulse 520 sets the system into superposition of the $m_s=0$ and $m_s=+1$ spin states (or, alternatively, the $m_s=0$ and $m_s=-1$ spin states, depending on the choice of resonance location). During a period 2, the system is allowed to freely precess (and dephase) over a time period referred to as tau ($\tau$). During this free precession time period, the system measures the local magnetic field and serves as a coherent integration. Next, a second RF excitation pulse 540 (in the form of, for example, a MW $\pi/2$ pulse) is applied during a period 3 to project the system back to the $m_s=0$ and $m_s=+1$ basis. Finally, during a period 4, a second optical pulse 530 is applied to optically sample the system and a measurement basis is obtained by detecting the fluorescence intensity of the system. The RF excitation pulses applied are provided at a given RF frequency, which correspond to a given NV center orientation.

Figure 5B:
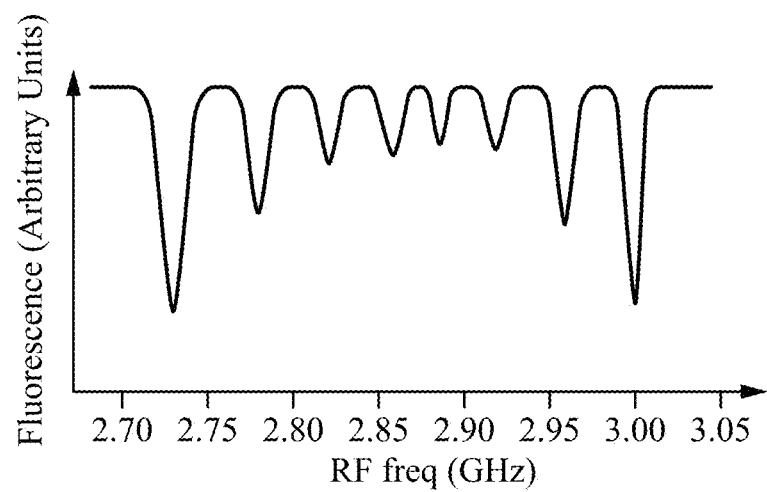
FIG. 5B illustrates a graph of the fluorescence as a function of an applied RF frequency for four different magneto-optical defect center orientations for a non-zero magnetic field.

In general, the NV diamond material 320 will have NV centers aligned along directions of four different orientation classes. FIG. 5B illustrates fluorescence as a function of RF frequency for the case where the NV diamond material 320 has NV centers aligned along directions of four different orientation classes. In this case, the component $B_z$ along each of the different orientations may be determined. These results, along with the known orientation of crystallographic planes of a diamond lattice, allow not only the magnitude of the external magnetic field to be determined, but also the direction of the magnetic field.

While FIG. 3 illustrates an NV center magnetic sensor system 300 with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material. Magneto-optical defect center materials include but are not limited to diamonds, Silicon Carbide (SiC) and other materials with nitrogen, boron, or other chemical defect centers. Our references to diamond-nitrogen vacancies and diamonds are applicable to magneto-optical defect center materials and variations thereof.

Figure 6:
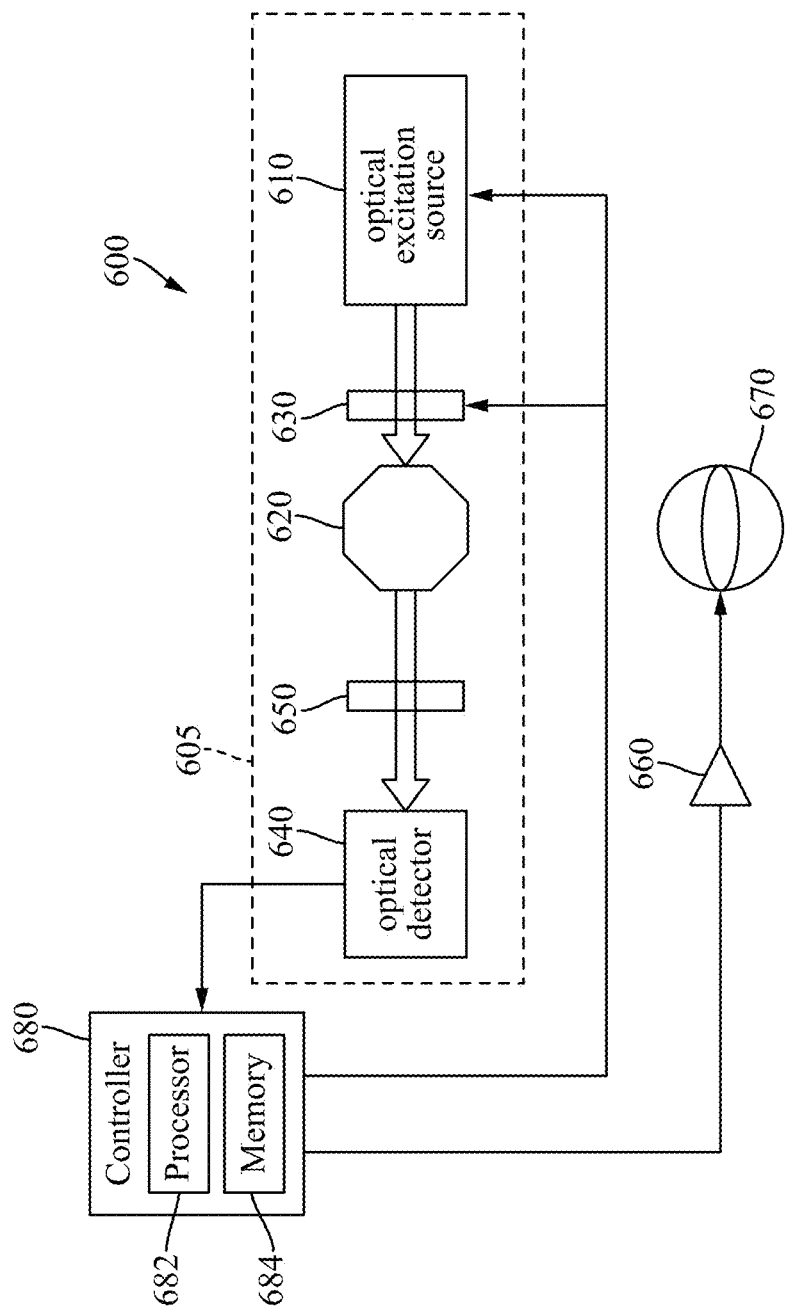
FIG. 6 illustrates a schematic diagram of some implementations of a magneto-optical defect center magnetometry system.

FIG. 6 is a schematic diagram of a system 600 for a magneto-optical defect center magnetometry system according to some embodiments. The system 600 can include an optical excitation source 610, which can generate and direct optical excitation to an NV diamond material 620 with NV centers, or another magneto-optical defect center material with magneto-optical defect centers. An RF excitation source 630 can provide RF radiation to excite the NV diamond material 620. A magnetic field generator 670 can generate a magnetic field, which is detected at the NV diamond material 620.

The magnetic field generator 670 may generate magnetic fields with orthogonal polarizations, for example. In this regard, the magnetic field generator 670 may include two or more magnetic field generators, such as two or more Helmholtz coils or other magnetic electronic devices. The two or more magnetic field generators may be configured to generate corresponding magnetic fields having predetermined directions Each of the two or more magnetic field generators can provide a corresponding relatively uniform magnetic field at the NV diamond material 620. The predetermined directions may be orthogonal to one another. In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600 may be arranged to include one or more optical detection systems 605, where each of the optical detection systems 605 can include the optical detector 640, optical excitation source 610, and NV diamond material 620. Furthermore, the magnetic field generator 670 may have a relatively high power as compared to the one or more optical detection systems 605. In this way, the one or more optical systems 605 may be deployed in an environment that requires a relatively lower power for the optical systems 605, while the magnetic field generator 670 may be deployed in an environment that has a relatively high power available for the magnetic field generator 670 so as to apply a relatively strong magnetic field.

The system 600 further includes a controller 680 configured to receive a light detection signal from the optical detector 640 and generate a magnetometry curve as a function of the RF excitation frequency based, at least in part, on the light detection signal. The controller 680 can generate a representation of the magnetic field using the magnetometry curve. The controller 680 can be configured to control the optical excitation source 610, the RF excitation source 630, the two or more magnetic field generators 670, or a combination thereof. The controller 680 may be a single controller, or may have multiple subcontrollers. For a controller 680 including multiple subcontrollers, each of the subcontrollers may perform different functions, such as controlling different components of the system 600. The two or more magnetic field generators 670 may be controlled by the controller 680 via an amplifier 660, for example.

The RF excitation source 630 may be a microwave coil, for example. The RF excitation source 630 can emit RF radiation with a photon energy resonant with the transition energy between the ground $m_s=0$ spin state and the $m_s=+1$ spin states as discussed above with respect to FIG. 3. The excitation source 630 can emit RF radiation at other non-resonant photon energies.

The optical excitation source 610 may be a laser or a light emitting diode, for example, which is capable of emitting light in the green band or other light band. The optical excitation source 610 can induce red fluorescence from the NV diamond material 620, where the fluorescence corresponds to an electron transition from the excited state to the ground state. Light from the NV diamond material 620 may be directed through the optical filter 650 to filter out light in the excitation band (e.g., in the green band), and to pass light in the red fluorescence band, which in turn may be detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 may be configured to control the optical excitation source 610, the RF excitation source 630, the magnetic field generator 670, or a combination thereof. The controller may include a processor 682, a memory 684, electronic circuitry or a combination thereof. The memory 684, which may include a nontransitory computer readable medium, may store instructions executable by the processor 682 to allow controlling of the operation of the optical excitation source 610, the RF excitation source 630, the magnetic field generator 670 or a combination thereof. That is, the controller 680 may be programmed with executable instructions, for example, to perform control operations and to compute a magnetic field representations.

According to certain embodiments, the controller 680 can control the operation of the optical excitation source 610, the RF excitation source 630, the magnetic field generator 670 or a combination thereof to perform Optically Detected Magnetic Resonance (ODMR). Specifically, the magnetic field generator 670 may be used to apply a bias magnetic field that sufficiently separates the intensity responses corresponding to electron spin resonances for each of the four NV center orientations. The controller 680 can control characteristics (e.g., intensity, direction, timing) of magnetic fields generated by the magnetic field generator 670. The controller 680 can control the optical excitation source 610 to provide optical excitation to the NV diamond material 620, the RF excitation source 630 to provide RF excitation to the NV diamond material 620, or a combination thereof. For instance, the controller 680 can control the characteristics (e.g., frequency spectrum, amplitude, phase, or a combination thereof) of RF signals emitted by the RF excitation source 610 and the timing of emission of the RF signals. The controller 680 can control the characteristics (e.g., color or frequency band, intensity, polarization, or a combination thereof) of optical signals emitted by the optical excitation source 630 and the timing of emission of the optical signals.

The controller 680 can collect (or receive) resulting fluorescence intensity responses for each of the NV axes over time to determine the components of the external magnetic field $B_z$ aligned along directions of the four NV center orientations which respectively correspond to the four diamond lattice crystallographic axes of the NV diamond material 620. The controller 680 can use determined the components of the external magnetic field $B_z$ to calculate the estimated vector magnetic field acting on the system 600. The excitation scheme utilized during the measurement collection process (e.g., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters $\pi$ and $\tau$ may be optimized using Rabi analysis and FID-Tau sweeps prior to the collection process, as described in, for example, U.S. patent application Ser. No. 15/003,590 entitled "APPARATUS AND METHOD FOR HIGH SENSITIVITY MAGNETOMETRY MEASUREMENT AND SIGNAL PROCESSING IN A MAGNETIC DETECTOR SYSTEM" filed Jan. 21, 2016, the contents of which are hereby incorporated by referenced in its entirety. The pulse parameters $\pi$ and $\tau$ may also be optimized using other optimization schemes.

During the measurement collection process, fluctuations may occur in the measured intensity response due to effects caused by components of the system 600, rather than due to true changes in the external magnetic field. For example, prolonged optical excitation of the NV diamond material by the optical excitation source 610 may cause vertical (e.g., red photoluminescence intensity) fluctuations, or vertical drift, in the intensity response, causing the response curve to shift upward or downward over time.

The controller 680 can cause the RF excitation source 630 and/or the optical excitation source 610 to excite the NV diamond material 620 according to a Ramsey pulse sequence or some other pulse sequence. The Ramsey pulse sequence is a pulsed RF scheme that is believed to measure the free precession of the magnetic moment of spin states in a magnetic field. In some implementations, two or more than two pulse sequences may be used, such as those described in U.S. Patent Application No. 62/531,340 entitled "PHASE SHIFTED MAGNETOMETRY ADAPTIVE CANCELLATION" filed Jul. 11, 2017, the contents of which are hereby incorporated by referenced in its entirety. In general, the pulse sequence used can include one or more RF pulses (or RF excitation signals).

In some implementations, the optical excitation for the Ramsey pulse sequence may be in the form of a continuous wave optical excitation which is continuous before, during and after each pair of RF excitation pulses. Such a continuous wave technique for the optical excitation (read out) in a Ramsey pulse sequence is described, for example, in U.S. patent application Ser. No. 15/380,419 entitled "SELECTED VOLUME CONTINUOUS ILLUMINATION MAGNETOMETER" filed Dec. 15, 2016, the contents of which are hereby incorporated by referenced in its entirety.

Figure 7:
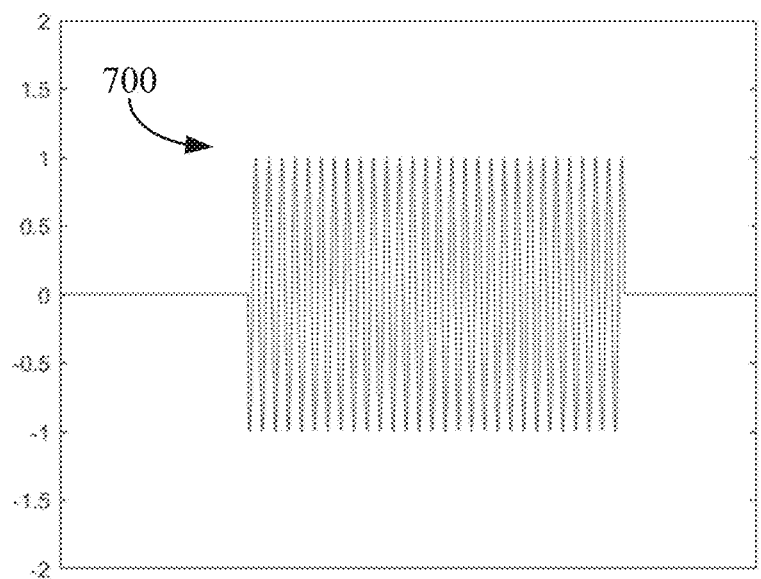
FIG. 7 illustrates a graph of a rectangular RF pulse window.
Figure 8:
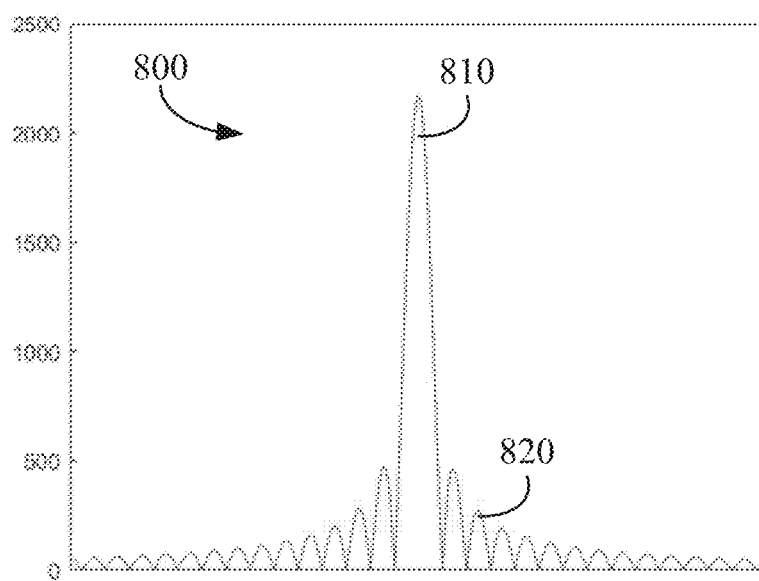
FIG. 8 illustrates a frequency spectrum of the rectangular RF pulse window of FIG. 7.

As shown in FIG. 7, an example RF pulse can be generated as a rectangular windowed RF pulse 700. That is, when a magneto-optical defect center magnetometer is operated in pulsed mode by using RF pulses to excite the magneto-optical defect center spin, rectangular windowed RF pulses 700 are generated and used for Rabi, Ramsey, or other pulse sequences. These rectangular windowed RF pulses are derived from a model whereby the magneto-optical defect center is excited by an RF tone for a specified length of time. However, any tone of finite duration will contain additional frequency content. For a rectangular windowed RF pulse 700, the spectrum 800 of frequency content, shown in FIG. 8, that is distributed around the carrier in a $\sin(x)/x$ distribution with the bulk of the energy located in the main lobe 810, while the remaining energy is located in an infinite set of side lobes 820 that decrease in strength from the main lobe 810. An optical excitation pulse may be applied to the system to optically pump electrons into the ground state (i.e., $m_s=0$ spin state). This may be followed by a first rectangular windowed RF excitation pulse having a predefined pulse width. The first rectangular windowed RF excitation pulse may set the system into a superposition of the $m_s=0$ and $m_s=+1$ spin states (or, alternatively, the $m_s=0$ and $m_s=-1$ spin states, depending on the choice of resonance location). Following the first rectangular windowed RF excitation pulse, the spins are allowed to freely precess (and dephase) over a time period $\tau_1$. During this free precession time period, the system precesses in the local magnetic field at a rate proportional to the magnetic field and serves as a coherent integration. Next, a second rectangular windowed RF excitation pulse may be applied to project the system back to the $m_s=0$ and $m_s=+1$ basis (or, alternatively, the $m_s=0$ and $m_s=-1$ spin states, depending on the choice of resonance location). The pulse width of the first and second rectangular windowed RF excitation pulses may be the same, for example. In some implementations, the pulse width of the first and second rectangular windowed RF excitation pulses may different from one another. Finally, a second optical pulse may be applied to optically sample the system and a measurement basis may be obtained by detecting the fluorescence intensity from the magneto-optical defect center material.

The first and second rectangular windowed RF excitation pulses may have a phase difference (e.g., a non-zero phase difference) with respect to each other. The phase for each of the first and second rectangular RF excitation pulses may be set by the controller 680. The controller 680 may include (or may be coupled to) a digital phase shifter for controlling the phase of the rectangular windowed excitation pulses.

Figure 9:
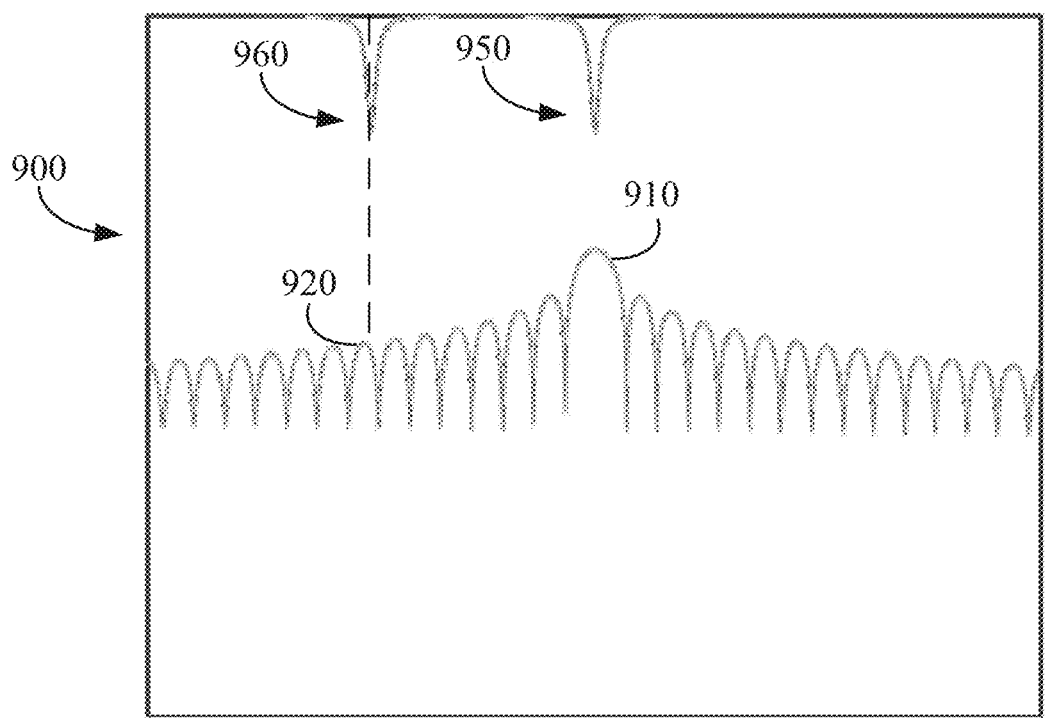
FIG. 9 illustrates a graph of the frequency spectrum of FIG. 8 and showing example excitation frequency resonances for two axes of a magneto-optical defect center element relative to the frequency spectrum.

For multi-axis magnetometry devices, a potential error source can arise when the side lobe response of a pulse exciting one axis interferes with a main lobe response of a pulse exciting a separate axis. That is, as shown in FIG. 9, the main lobe 910 of a rectangular windowed RF pulse 900 may be used to excite a first axis of a magneto-optical defect center element to produce a first resonance 950. In some instances, a second axis of the magneto-optical defect center element may have a second resonance 960 with which the side lobes 920 of the rectangular windowed RF pulse 900 can interfere. This inter-axis interference can result in measurement inaccuracies that can degrade performance in certain applications. Rectangular windowed RF pulses, such as that shown in FIG. 7, have a low side lobe-drop off rate (SLDR), meaning the intensity of the side lobes 820 of FIG. 8 decrease at a low logarithmic rate as the distance from the frequency of the main lobe 810 increases. As a result, the response of the side lobe 920 from a RF pulse for a first axis of the magneto-optical defect center element can interfere with a main lobe response for a second axis of the magneto-optical defect center element, such as that shown in FIG. 9. Also, the levels of RF pulse side lobes increase with increasing RF power leading to increase in inter-axis interference.

In some instances, a larger bias magnet can be implemented to increase the resonant frequency separation between baseline magneto-optical defect center element lattices to shift the main lobe resonance response for the second axis of the magneto-optical defect center element to a lower intensity side lobe (e.g., farther away from the main lobe) to reduce the inter-axis interference. However, the side lobe drop-off rate occurs as a low logarithmic rate for a rectangular windowed RF pulse, therefore calling for a larger frequency separation to decrease the intensity of the side lobes 920.

Figure 10:
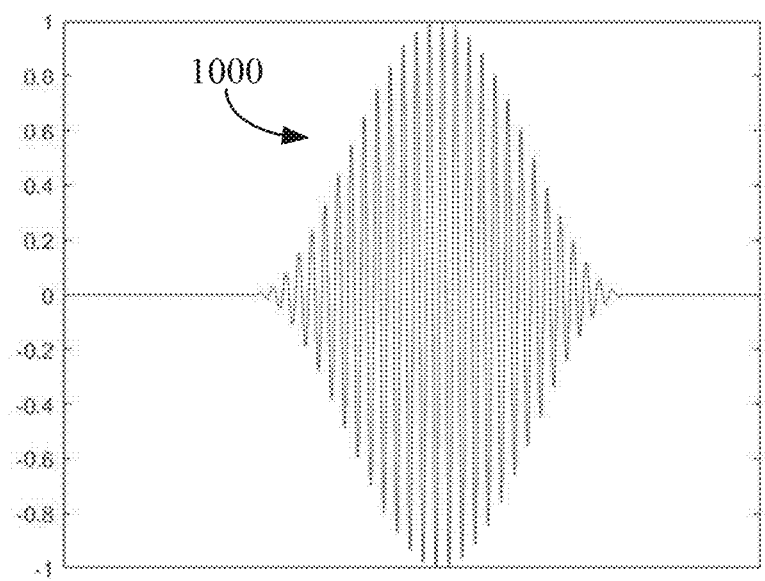
FIG. 10 illustrates a graph of a Hann RF pulse window.
Figure 11:
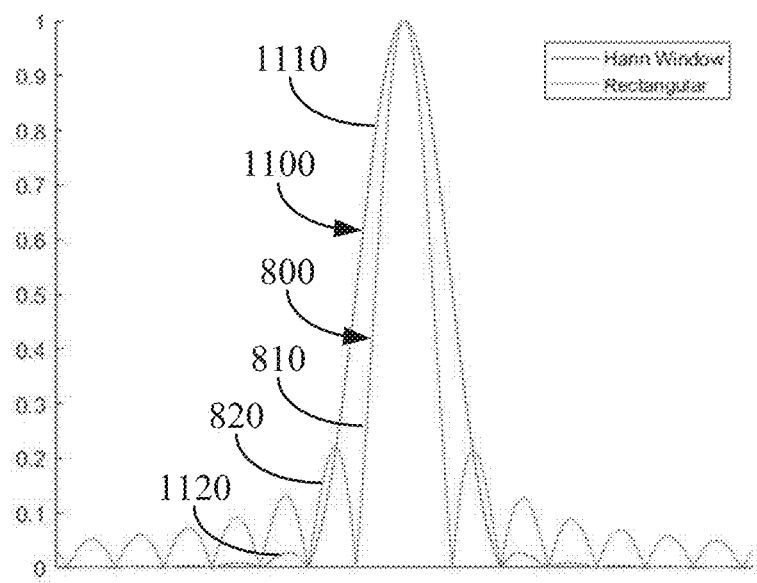
FIG. 11 illustrates a frequency spectrum of the Hann RF pulse window of FIG. 10 relative to the frequency spectrum of FIG. 8 of the rectangular RF pulse window.

A weighting function for the RF window (e.g., a Hann window, Hamming window, Parzen window, Welch window, sine window, triangular window or the like) can be utilized to shape the RF pulse such that the intensity of the side lobes can be reduced as the distance in frequency from the main lobe increases. That is, the weighting function for the windowing can be selected to produce a more rapid decay of the intensity of the side lobes for the energy in the pulse. As shown in FIG. 10, an example RF pulse can be generated as a Hann windowed RF pulse 1000. Instead of a square pulse for the rectangular windowed RF pulse of FIG. 7, the Hann windowed RF pulse 1000 has a cosine or a cosine squared profile to have lower intensity initially, building to a peak intensity, and then decreasing in intensity back to zero. The resulting Hann windowed RF pulse has a spectrum 1100 of frequency content, shown in FIG. 11, that is distributed around the main lobe 1110 with a high SLDR and can be used to shape the RF pulses such that the intensity of the resulting side lobes 1120 is significantly reduced as the distance in frequency from the main lobe 1110 increases. As the resulting side lobes 1120 have a reduced intensity at shorter frequency distances from the main lobe 1110, the result is a reduction in inter-axis interference without shifting the main lobe resonance response for a second axis of the magneto-optical defect center element. Other windowed RF pulses (e.g., with a SLDR exceeding a predefined threshold value or with some other characteristics) can be achieved using other weighting functions such as a Hamming window, Parzen window, Welch window, sine window, Nuttall window, Blackman-Nuttall window, Blackman-Harris window, Gaussian window, triangular window or the like. The rectangular windowed RF pulse, in comparison, has larger side lobes 820 with a lower SLDR.

While the Hann windowed RF pulse decreases the side lobe 1120 intensity, the intensity of the main lobe 1110 can be reduced relative to a similar powered rectangular windowed RF pulse, which results in less RF energy at the carrier frequency for the main lobe 1110. The carrier energy can be recovered by increasing the RF power, and a Hann window function is well-suited due to the fact it produces a large SLDR with a minimal decrease in frequency resolution for the main lobe 1110.

Figure 12:
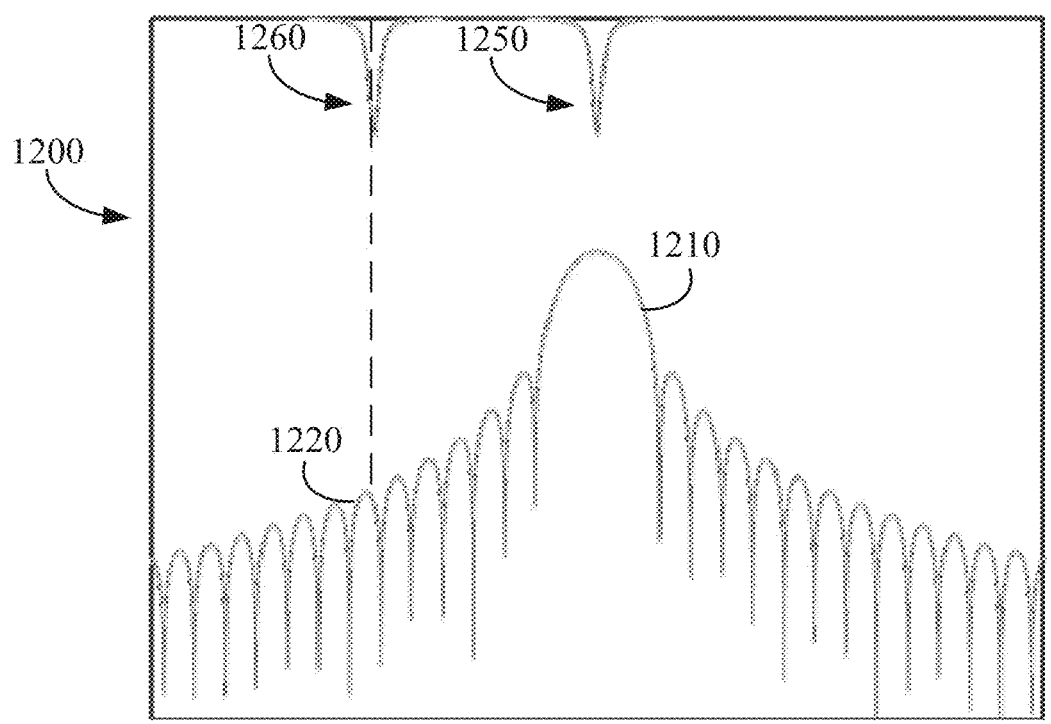
FIG. 12 illustrates a graph of the frequency spectrum of the Hann RF pulse window and showing example excitation frequency resonances for two axes of a magneto-optical defect center element relative to the frequency spectrum.

For multi-axis magnetometry devices, the side lobe response of a pulse exciting one axis has a reduced interference with a main lobe response of a pulse exciting a separate axis. That is, as shown in FIG. 12, the main lobe 1210 of a Hann windowed RF pulse 1200 may be used to excite a first axis of a magneto-optical defect center element to produce a first resonance 1250. In some instances, a second axis of the magneto-optical defect center element may have a second resonance 1260 corresponding to the side lobe 1220 of the Hann windowed RF pulse having a reduced intensity, therefore resulting in lower interference relative to the interference associated with the rectangular windowed RF pulse shown in FIG. 9.

While a Hann window function has been described above in reference to FIGS. 10-12, other weighting functions for windowing can be utilized, such as a Hamming window function, Chebyshev window function, Riemann window function, Hanning-Poisson window function, Taylor window function, Parzen window function, Welch window function, sine window function, Nuttall window function, Blackman-Nuttall window function, Blackman-Harris window function, Gaussian window function, triangular window function, etc. In some implementations, a cubed or fourth powered cosine weighted Hann function can be implemented as well.

In implementations employing windowing functions, such as the Hann window function, an optical excitation pulse may be applied to the system to optically pump electrons into the ground state (i.e., $m_s=0$ spin state). This may be followed by a first Hann windowed RF excitation pulse having a pulse width. The first Hann windowed RF excitation pulse may set the system into a superposition of the $m_s=0$ and $m_s=+1$ spin states (or, alternatively, the $m_s=0$ and $m_s=-1$ spin states, depending on the choice of resonance location). Following the first Hann windowed RF excitation pulse, the spins are allowed to freely precess (and de-phase) over a time period $\tau_1$. During this free precession time period, the system precesses in the local magnetic field at a rate proportional to the magnetic field and serves as a coherent integration. Next, a second Hann windowed RF excitation pulse may be applied to project the system back to the $m_s=0$ and $m_s=+1$ basis (or, alternatively, the $m_s=0$ and $m_s=-1$ spin states, depending on the choice of resonance location). The pulse width of the first and second Hann windowed RF excitation pulses may be the same, for example. Finally, a second optical pulse may be applied to optically sample the system and a measurement basis may be obtained by detecting the fluorescence intensity from the magneto-optical defect center material.

The first and second Hann windowed RF excitation pulses (or other first and second weighted windowed RF excitation pulses) may have a phase difference with respect to each other. The phase for each of the first and second windowed RF excitation pulses may be set by the controller 680. The controller 680 may include a digital phase shifter for controlling the phase of the windowed RF excitation pulses. The controller 680 may also include a linear amplifier and a waveform generator for generating the weighted function to generate the RF pulse having the weighted function window profile, such as the Hann RF window described above.

As the windowing function can affect the frequency response of the system, the time period, $\tau$, between pulses and/or the pulse width can be empirically determined, such as through an exhaustive search over pulse width and precession time. The time period $\tau$ can be determined (e.g., by the controller 680) based on the pulse width of the RF pulses used.

In some implementations, the controller 680 (or other entity) can select the weighted RF pulse(s), or the corresponding weighting window function, such that the weighting window function (or the weighted RF pulse(s)) can have a side lobe-drop off rate (SLDR) higher than a predefined threshold value. The controller 680 (or other entity) may select the weighted RF pulse(s) or the corresponding weighting window function such that the frequency spectrum of the weighting window function (or the weighted RF pulse) can exhibit a null at a predefined frequency. For instance, the null may be defined to overlap or coincide with a resonance frequency of another axis of the NV diamond material 620 to mitigate inter-axes interference. The controller 680 (or other entity) may select the weighted RF pulse(s) or the corresponding weighting window function such that the frequency spectrum of the weighting window function (or the weighted RF pulse(s)) can have a sidelobe at a predefined frequency (e.g., overlapping or coinciding with a resonance frequency of one of the axes of the NV diamond material 620). The sidelobe may be defined to have an amplitude greater than or equal to a predefined value. In general, the controller 680 (or other entity) may select the weighting window function to modify the frequency spectrum.

Figure 13:
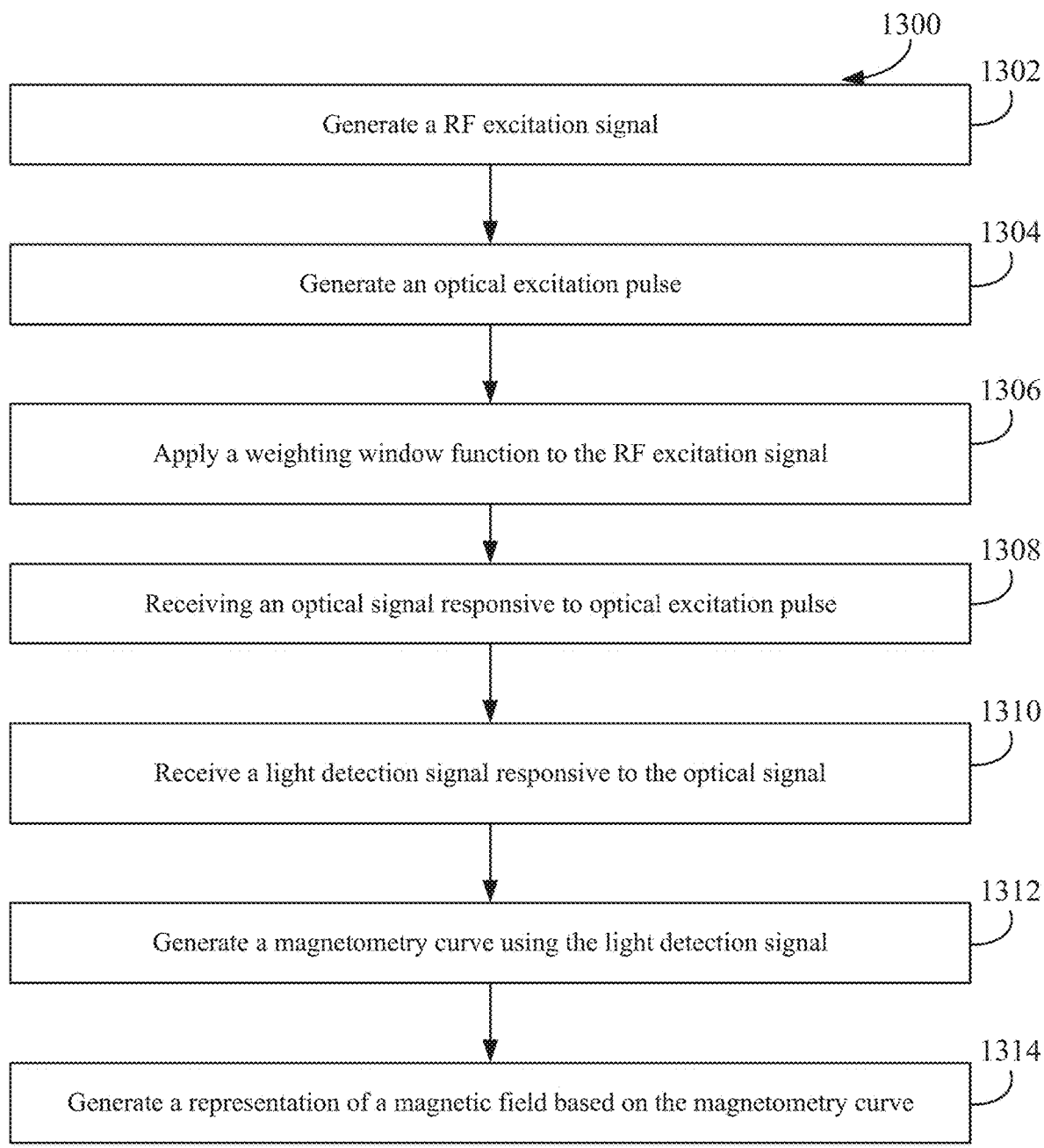
FIG. 13 illustrates an implementation of a method for detecting a magnetic field using a weighted RF pulse window.

Referring to FIG. 13, a flowchart of a process (or method) 1300 for detecting a magnetic field is shown, according to inventive concepts of this disclosure. The process 1300 can be performed, for example, by the system 600 (shown in FIG. 6) or components thereof. The process 1300 can include generating a a radiofrequency (RF) excitation signal (block 1302) and generating an optical excitation pulse (block 1304). The method 1300 can include applying a weighting window function to the RF excitation signal (block 1306). The method 1300 can include an optical detector receiving an optical signal responsive to the optical excitation pulse (block 1308), and a controller (e.g., the controller 680 or a processor associated with the system 600) receiving a light detection signal responsive to optical detector receiving the optical signal (block 1308). The method 1300 can include generating a magnetometry curve using the light detection signal (block 1312), and generating a representation of a magnetic field based on the magnetometry curve (block 1314).

The method 1300 can include a RF excitation source (such as the RF excitation source 630) generating at least one RF excitation signal to excite a magneto-optical defect center element, such as the NV diamond material 620 (block 132). The RF excitation source 630 can be configured to generate a single RF excitation signal or an RF excitation sequence including a plurality of RF excitation signals.

The method 1300 can include an optical excitation source, such as the optical excitation source 610, generating an optical excitation pulse. The optical excitation source 610 can emit the optical excitation pulse towards the magneto-optical defect center element, such as the NV diamond material 620. The optical excitation source 610 can generate and emit one or more optical excitation pulses. The optical excitation source 610 can generate the optical excitation pulse(s) in a predefined color (or frequency) band, such as the green band.

The method 1300 can include applying a weighting window function to the one or more RF excitation pulses to generate one or more corresponding weighted windowed RF excitation pulses (block 1308). The controller 680 can cause a waveform generator and a linear amplifier to generate a predefined weighting window function (e.g., a non-rectangular weighting window function). That is, the controller 680 can include (or can be coupled to) a waveform generator and a linear amplifier specific to the weighting function to be generated or used. The controller 680 may output one or more parameter values to a separate waveform generator and/or linear amplifier to generate a predefined weighting function. For instance, the controller 680 can provide samples of the weighting window function to the waveform generator. The weighting window function can be a non-rectangular window function, such as Hann window function, a Hamming window function, Chebyshev window function, Riemann window function, Hanning-Poisson window function, Taylor window function, Parzen window function, Welch window function, sine window function, Nuttall window function, Blackman-Nuttall window function, Blackman-Harris window function, Gaussian window function, triangular window function, or the like.

The controller 680 can cause the weighting window function to be provided to the RF excitation source 630 or other component of the system 600 (e.g., a multiplier component or a filtering component). The controller 680 can control the RF excitation source by outputting the non-rectangular weighting function to the RF excitation source and/or causing the non-rectangular weighting function to be output to the RF excitation source to generate a weighted windowed RF excitation pulse to irradiate a magneto-optical defect center element. Generating the weighted windowed RF excitation pulse(s) may include multiplying (e.g., pointwise multiplication) the RF excitation signal with the weighting window function, or convolving (or filtering) the RF excitation signal with the weighting window function. In some implementations, the weighted windowed RF excitation pulse(s) can have a pulse width that is defined based on the weighting window function. For instance, the pulse width can be selected using Rabi analysis and FID-Tau sweeps prior to the collection process, as described in, for example, U.S. patent application Ser. No. 15/003,590 entitled "APPARATUS AND METHOD FOR HIGH SENSITIVITY MAGNETOMETRY MEASUREMENT AND SIGNAL PROCESSING IN A MAGNETIC DETECTOR SYSTEM" filed Jan. 21, 2016, the content of which is hereby incorporated by reference in its entirety.

In some implementations, the process 1300 can include generating a second weighted windowed RF excitation pulse. The controller can cause the weighting window function to be applied to a second RF excitation signal generated by the RF excitation source to generate a corresponding second weighted windowed RF excitation pulse. The second weighted windowed RF excitation pulse can be generated and emitted towards the magneto-optical defect center element a time period, τ after generating (or emitting) the first weighted windowed RF excitation pulse. In some implementations, the time period, τ, can be determined based on the non-rectangular weighting function. For example, the time period, τ, may be optimized using Rabi analysis and FID-Tau sweeps prior to the collection process, as described in, for example, U.S. patent application Ser. No. 15/003,590 entitled "APPARATUS AND METHOD FOR HIGH SENSITIVITY MAGNETOMETRY MEASUREMENT AND SIGNAL PROCESSING IN A MAGNETIC DETECTOR SYSTEM" filed Jan. 21, 2016, the content of which is hereby incorporated by referenced in its entirety. In some implementations, the pulse parameters, such as pulse width, it, and time period, τ, may also be optimized using other optimization schemes. In some implementations, the controller 680 can cause (or control) the RF excitation source 630 to generate a sequence of weighted windowed RF excitation pulses such that each pair of consecutive weighted windowed RF excitation pulses can be separated by a corresponding time period.

The weighted windowed RF excitation signals can be emitted (e.g., by the RF excitation source 630) towards the magneto-optical defect center element (e.g., NV diamond material 620). The controller 680 can control the direction of emission of the weighted windowed RF excitation signals.

The process 1300 can further include an optical detector (such as optical detector 640) receiving one or more optical signals from the towards the magneto-optical defect center element responsive to exciting the magneto-optical defect center element with the optical excitation pulse(s) and the one or more weighted windowed RF excitation pulses (block 1308). The controller 680 can cause the one or more weighted windowed RF excitation pulses and the optical excitation pulse(s) to be emitted towards the magneto-optical defect center element according to a predefined sequence or order. Applying the optical excitation pulse can include the optical excitation source irradiating the magneto-optical defect center element with optical light based on the optical excitation pulse.

The process 1300 can include the controller 680 receiving a light detection signal from the optical detector responsive to the optical detector receiving the one or more optical signals from the towards the magneto-optical defect center element (block 1310). The process 1300 can further include the controller 680 generating a magnetometry curve as a function of the RF excitation frequency based, at least in part, on the light detection signal (block 1312).

A magnetometry (detune) curve quantifies the expected red light intensity emitted from the diamond as a function of the detuning of the RF frequency relative to the NV resonance frequency. By measuring the amount of red light the diamond produces at any moment, one can infer the RF detuning value and hence the RF resonance value. Since the resonance frequencies are a function of the magnetic field, these measurements can then be used to infer the magnetic field value. The controller 680 can estimate the magnetometry curve by sweeping a known external magnetic field's projection on a diamond axes, and using the linearized relationship that the change in detuning is equal to the magnetic field projection multiplied by the diamond nitrogen vacancy (DNV) gyromagnetic ratio. As it can be difficult in practice to precisely align an external magnetic field to a given NV axis, an alternate technique to calculate the magnetometry curve is to maintain a fixed external magnetic field, sweep the RF frequency injected into the diamond, and record the corresponding red light levels emitted by the diamond.

The process 1300 can further include generating a representation of a magnetic field based, at least in part, on the magnetometry curve (block 1314). The representation of the magnetic field can be a numerical representation, a data structure, a graphical representation, or any other representation of data for the magnetic field. The controller 680 can generate the representation of the magnetic field, for example, according to techniques described in U.S. Pat. No. 9,541,610 B2, the content of which is hereby incorporated by referenced in its entirety.

Figure 14:
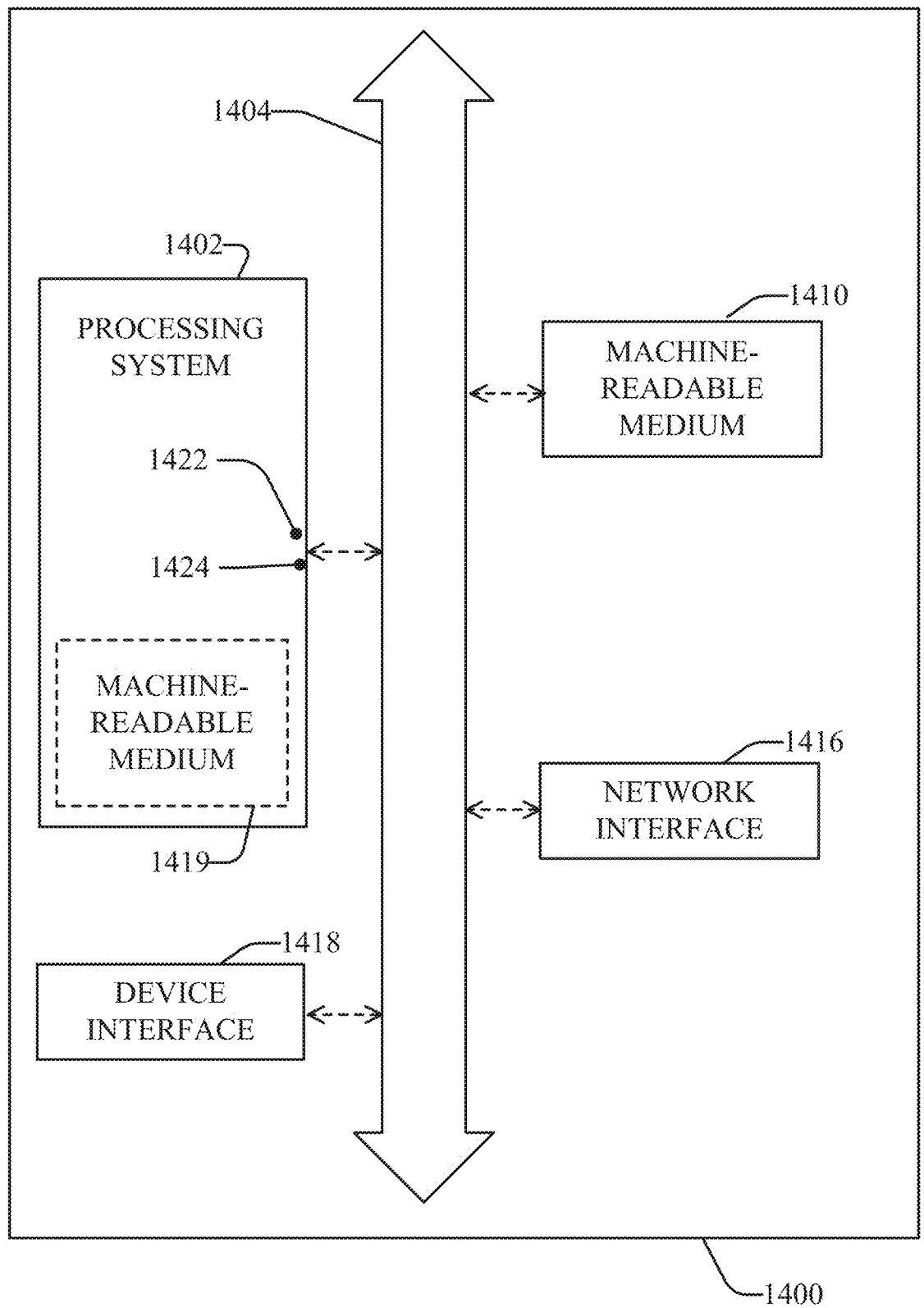
FIG. 14 is a block diagram illustrating a general architecture for a computer system that may be employed to implement various elements of the systems and methods described and illustrated herein.

FIG. 14 is a diagram illustrating an example of a system 1400 for implementing some aspects such as the controller. The system 1400 includes a processing system 1402, which may include one or more processors or one or more processing systems. A processor may be one or more processors. The processing system 1402 may include a general-purpose processor or a specific-purpose processor for executing instructions and may further include a machine-readable medium 1419, such as a volatile or non-volatile memory, for storing data and/or instructions for software programs. The instructions, which may be stored in a machine-readable medium 1410 and/or 1419, may be executed by the processing system 1402 to control and manage access to the various networks, as well as provide other communication and processing functions. The instructions may also include instructions executed by the processing system 1402 for various user interface devices, such as a display 1412 and a keypad 1414. The processing system 1402 may include an input port 1422 and an output port 1424. Each of the input port 1422 and the output port 1424 may include one or more ports. The input port 1422 and the output port 1424 may be the same port (e.g., a bi-directional port) or may be different ports.

The processing system 1402 may be implemented using software, hardware, or a combination of both. By way of example, the processing system 1402 may be implemented with one or more processors. A processor may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable device that can perform calculations or other manipulations of information.

A machine-readable medium may be one or more machine-readable media, including no-transitory or tangible machine-readable media. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

Machine-readable media (e.g., 1419) may include storage integrated into a processing system such as might be the case with an ASIC. Machine-readable media (e.g., 1410) may also include storage external to a processing system, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device. Those skilled in the art will recognize how best to implement the described functionality for the processing system 1402. According to one aspect of the disclosure, a machine-readable medium may be a computer-readable medium encoded or stored with instructions and may be a computing element, which defines structural and functional interrelationships between the instructions and the rest of the system, which permit the instructions' functionality to be realized. Instructions may be executable, for example, by the processing system 1402 or one or more processors. Instructions can be, for example, a computer program including code for performing methods of some of the embodiments.

A network interface 1416 may be any type of interface to a network (e.g., an Internet network interface), and may reside between any of the components shown in FIG. 14 and coupled to the processor via the bus 1404.

A device interface 1418 may be any type of interface to a device and may reside between any of the components shown in FIG. 14. A device interface 1418 may, for example, be an interface to an external device (e.g., USB device) that plugs into a port (e.g., USB port) of the system 1400.

One or more of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. In one or more implementations, the computer readable media does not include carrier waves and electronic signals passing wirelessly or over wired connections, or any other ephemeral signals. For example, the computer readable media may be entirely restricted to tangible, physical objects that store information in a form that may be readable by a computer. In one or more implementations, the computer readable media may be non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

The description is provided to enable any person skilled in the art to practice the various embodiments described herein. While some embodiments have been particularly described with reference to the various figures and configurations, it should be understood that these are for illustration purposes only and should not be taken as limiting the scope of the subject technology.

There may be many other ways to implement. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made by one having ordinary skill in the art, without departing from the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A system for magnetic detection of an external magnetic field, comprising:
   a magneto-optical defect center element comprising a plurality of magneto-optical defect centers;
   a radio frequency (RF) excitation source configured to generate at least one RF excitation signal to cause RF excitation of the magneto-optical defect center element;
   an optical excitation source configured to generate an optical excitation pulse to apply to the magneto-optical defect center element;
   an optical detector configured to receive an optical signal based on light emitted by the magneto-optical defect center element responsive to the optical excitation pulse; and
   a controller configured to:
      control the RF excitation source to generate the at least one RF excitation signal;
      cause a weighting window function to be applied to the at least one RF excitation signal generated by the RF excitation source to generate at least one corresponding weighted windowed RF excitation signal, the at least one weighted windowed RF excitation signal applied to the magneto-optical defect center element;
      receive a light detection signal from the optical detector responsive to the optical signal received by the optical detector based on the light emitted by the magneto-optical defect center element;

generate a magnetometry curve as a function of RF excitation frequency using, at least in part, the light detection signal;
generate a representation of a magnetic field based, at least in part, on the magnetometry curve.

2. The system of claim 1, wherein the weighting window function includes:
a Hann window function;
a Hamming window function;
a Hanning-Poisson window function;
a Riemann window function; or a Chebyshev window function.

3. The system of claim 1, wherein the RF excitation source is configured to:
cause the weighting window function to be applied to a first RF excitation signal generated by the RF excitation source to generate a corresponding first weighted windowed RF excitation signal, the first weighted windowed RF excitation signal applied to the magneto-optical defect center element;
cause the weighting window function to be applied to a second RF excitation signal generated by the RF excitation source to generate a corresponding second weighted windowed RF excitation signal, the second weighted windowed RF excitation signal applied to the magneto-optical defect center element a time period τ after applying the first weighted windowed RF excitation signal.

4. The system of claim 3, wherein the time period τ is defined based on the weighting window function.

5. The system of claim 3, wherein a first phase of the first RF excitation signal is different from a second phase of the second RF excitation signal.

6. The system of claim 1, wherein the weighting window function has a side lobe-drop off rate higher than a predefined threshold value.

7. The system of claim 1, wherein a frequency spectrum of the weighting window function exhibits a null at a predefined frequency.

8. The system of claim 1, wherein a frequency spectrum of the weighting window function has a sidelobe at a predefined frequency.

9. The system of claim 1, wherein the weighting window function is a non-rectangular weighting window function and at least one width of the at least one RF excitation signal is determined based on the non-rectangular weighting window function.

10. The system of claim 1, wherein the magneto-optical defect center element is a nitrogen vacancy (NV) diamond material comprising a plurality of NV centers.

11. A method for magnetic detection using a magneto-optical defect center element comprising a plurality of defect centers, the method comprising:
generating, by a radio frequency (RF) excitation source, at least one RF excitation signal to use for RF excitation of the magneto-optical defect center element;
generating, by an optical excitation source, an optical excitation pulse to apply to the magneto-optical defect center element;
applying a weighting window function to the at least one RF excitation signal generated by the RF excitation source to generate at least one corresponding weighted windowed RF excitation signal, the at least one weighted windowed RF excitation signal applied to the magneto-optical defect center element;
receiving, by an optical detector, an optical signal based on light emitted by the magneto-optical defect center element responsive to the optical excitation pulse;
receiving, by a controller, a light detection signal from the optical detector responsive to the optical signal received by the optical detector based on the light emitted by the magneto-optical defect center element;
generating a magnetometry curve as a function of RF excitation frequency using, at least in part, the light detection signal; and
generating a representation of a magnetic field based, at least in part, on the magnetometry curve.

12. The method of claim 11, wherein the weighting window function includes:
a Hann window function;
a Hamming window function;
a Hanning-Poisson window function;
a Riemann window function; or
a Chebyshev window function.

13. The method of claim 11, wherein applying the weighting window function to the at least one RF excitation signal includes:
applying the weighting window function a first RF excitation signal generated by the RF excitation source to generate a corresponding first weighted windowed RF excitation signal, the first weighted windowed RF excitation signal applied to the magneto-optical defect center element;
applying the weighting window function to a second RF excitation signal generated by the RF excitation source to generate a corresponding second weighted windowed RF excitation signal, the second weighted windowed RF excitation signal applied to the magneto-optical defect center element a time period τ after applying the first weighted windowed RF excitation signal.

14. The method of claim 13, wherein the time period τ is defined based on the weighting window function.

15. The method of claim 13, wherein a first phase of the first RF excitation signal is different from a second phase of the second RF excitation signal.

16. The method of claim 11, wherein the weighting window function has a side lobe-drop off rate higher than a predefined threshold value.

17. The method of claim 11, wherein a frequency spectrum of the weighting window function exhibits a null at a predefined frequency.

18. The method of claim 11, wherein a frequency spectrum of the weighting window function has a sidelobe at a predefined frequency.

19. The system of claim 11, wherein the weighting window function is a non-rectangular weighting window function and at least one width of the at least one RF excitation signal is determined based on the non-rectangular weighting window function.

20. The system of claim 11, wherein the magneto-optical defect center element is a nitrogen vacancy (NV) diamond material comprising a plurality of NV centers.

* * * * *